United States Patent [19]
Song

[11] Patent Number: 5,637,526
[45] Date of Patent: Jun. 10, 1997

[54] METHOD OF MAKING A CAPACITOR IN A SEMICONDUCTOR DEVICE

[75] Inventor: Taik G. Song, Ichon-Gun, Rep. of Korea

[73] Assignee: Hyundai Electronics Industries Co., Ltd., Kyungki-Do, Rep. of Korea

[21] Appl. No.: 549,572

[22] Filed: Oct. 27, 1995

[30]     Foreign Application Priority Data

Oct. 27, 1994 [KR]   Rep. of Korea ........................ 94-27625

[51] Int. Cl.$^6$ ............................................... H01L 21/8242
[52] U.S. Cl. ........................................... 438/253; 438/396
[58] Field of Search ................................. 437/47, 60, 919

[56]            References Cited

U.S. PATENT DOCUMENTS

| | | | |
|---|---|---|---|
| 4,997,794 | 3/1991 | Josquin et al. | 437/919 |
| 5,397,729 | 3/1995 | Kayanuma et al. | 437/60 |
| 5,470,775 | 11/1995 | Nariani | 437/919 |
| 5,500,387 | 3/1996 | Tung et al. | 437/919 |

FOREIGN PATENT DOCUMENTS 5-55462   3/1993   Japan .............................. H01L 27/04

*Primary Examiner*—Tom Thomas
*Attorney, Agent, or Firm*—Fish & Richardson, P.C.

[57]           ABSTRACT

First and second imaginary capacitors having top and bottom plates are provided on a substrate. The top plate of the first imaginary capacitor and the bottom plate of the second imaginary capacitor are connected by metal wires, thereby forming a first plate of a real capacitor. The bottom plate of the first imaginary capacitor and the top plate of the second imaginary capacitor are connected by metal wires, thereby forming a second plate of the real capacitor. The real capacitor of the present invention is produced with a dielectric film formed between the first plate and the second plate of the real capacitor. The area of the first plate of the real capacitor is identical that of the second plate of the real capacitor.

7 Claims, 4 Drawing Sheets

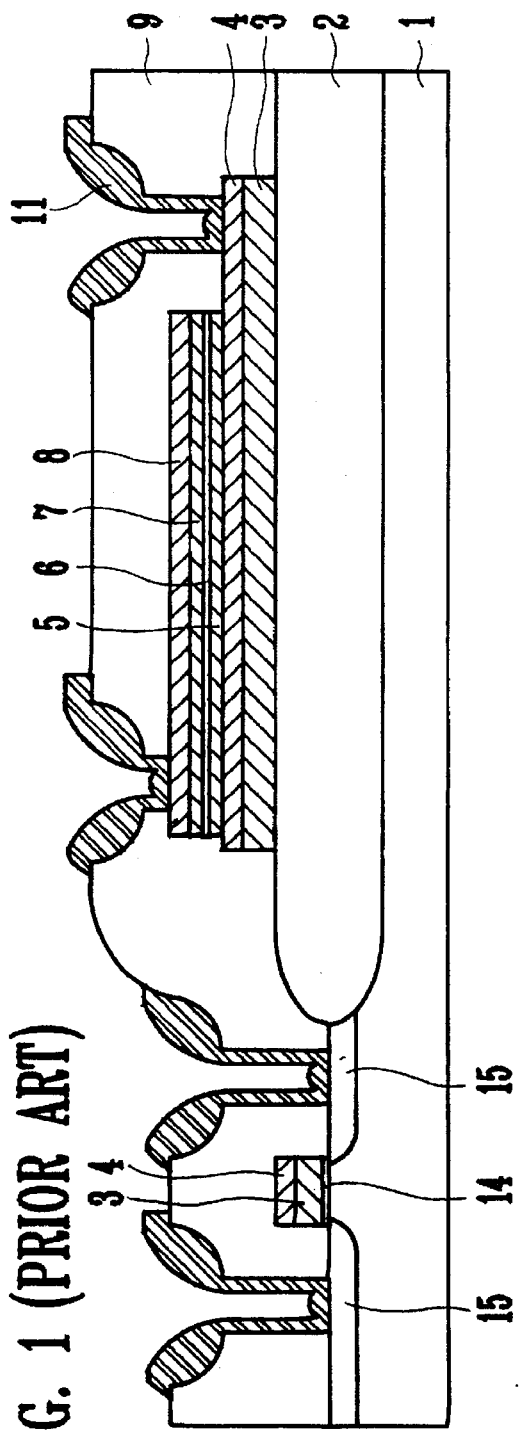
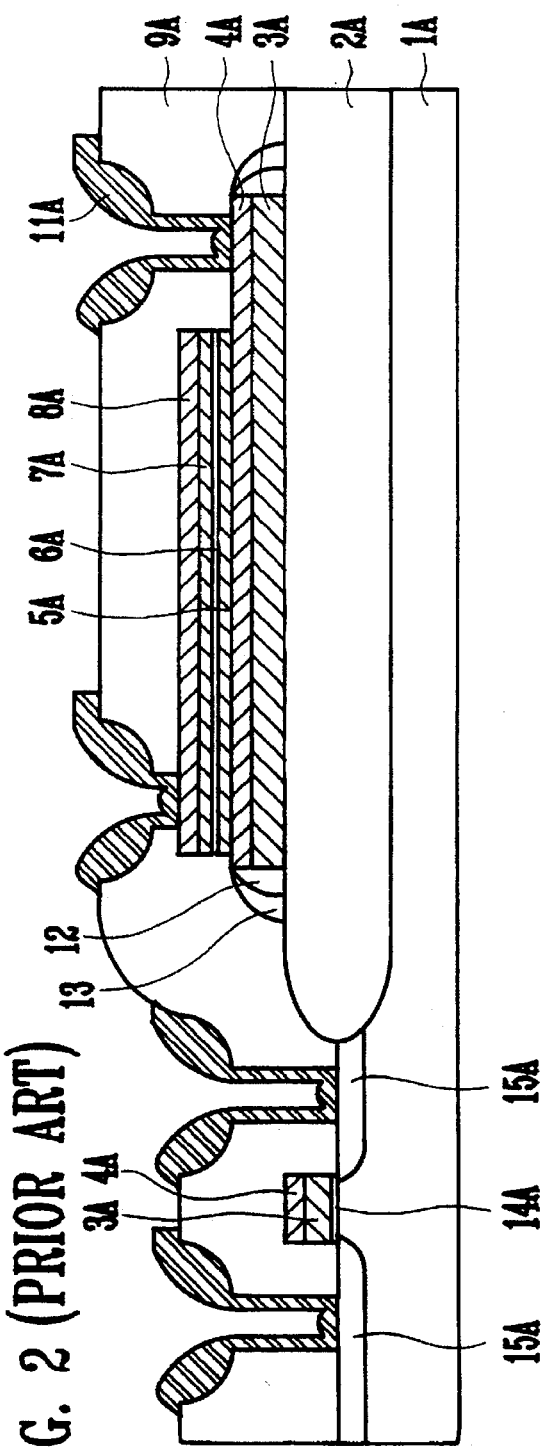

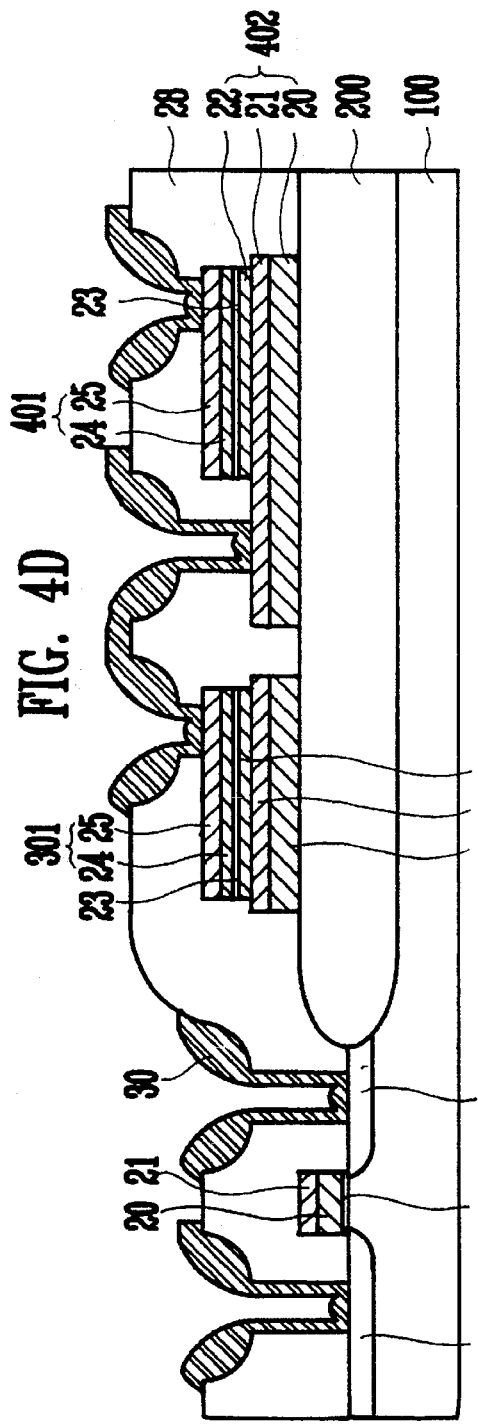
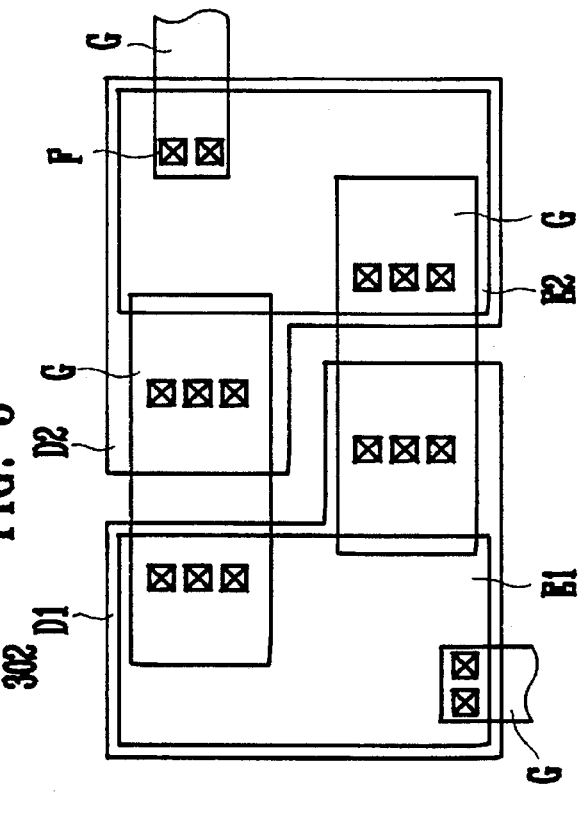

METHOD OF MAKING A CAPACITOR IN A SEMICONDUCTOR DEVICE

FIELD OF THE INVENTION

The present invention relates to the capacitor of a semiconductor device and the method of manufacturing the same.

BACKGROUND OF THE INVENTION

A method of manufacturing a capacitor according to a prior art will be described briefly with reference to FIGS. 1 and 3.

An active region A and a field region B are defined by isolation technology. A field oxide film 2 is formed on a silicon substrate 1 in the field region B. A gate oxide film 14 of the transistor is formed on the silicon substrate 1 in the active region A. A first polysilicon layer 3, a first tungsten silicide layer 4 and a second polysilicon layer 5 with a high impurity concentration are sequentially formed on the field oxide film 2 and the gate oxide film 14. A dielectric film 6 with an ONO(Oxide-Nitride-Oxide) structure is formed on the second polysilicon layer 5. A third polysilicon layer 7 with a high impurity concentration and second tungsten silicide layer 8 are sequentially formed on the dielectric film 6. Then, the third polysilicon layer 7 with a high impurity concentration and the second tungsten silicide layer 8 are patterned by a first mask work and a first etching process, whereby a top plate of the capacitor consisting of the third polysilicon layer 7 and the second tungsten silicide layer 8 is formed at the top plate region E of the capacitor. During the first etching process, the dielectric film 6 and the second polisilicon layer 5 are patterned. Then, the first polysilicon layer 3 and the first tungsten silicide layer 4 are patterned by a second mask work and a second etching process, whereby the bottom plate consisting of the first polysilicon layer 3 and the first tungsten silicide 4 is formed at the bottom plate region D of the capacitor. Also the gate electrode consisting of the first polysilicon layer 3 and the first tungsten silicide layer 4 is formed on the silicon substrate 1 of a gate electrode region C. The bottom plate of the capacitor includes the patterned second polysilicon layer 5.

To complete the formation of the transistor at the active region A, a diffusion region 15 is formed by a source and drain impurity ion implantation process.

Then, after an interlayer insulation film 9 is formed on the entire structure including the transistor and the capacitor, using a metal contact process, a plurality of metal wires 11 are connected to the diffusion region 15 of the transistor and each of the top and bottom plates of the capacitor at a contact region F. The metal wires 11 are formed at the metal wire region G.

A method of manufacturing a capacitor according to another prior art will be described briefly with reference to FIGS. 2 and 3.

The capacitor shown in FIG. 2 has an insulation spacer 12 and a filament 13 formed at the bottom plate portion. As such, the detailed description for each element will be omitted and each of the numbers indicated in FIG. 2 shall correspond to the numbers indicated in FIG. 1 except for the "A" attached thereto.

According to the prior arts, the top plate of the capacitor is first formed and then the bottom plate of the capacitor and the gate electrode of the transistor are formed. The area of the bottom plate must be much larger than that of the top plate in consideration of a margin of metal contact process.

As the areas of the top and bottom plates differ, their capacitance values are asymmetric. As a result, when the semiconductor device is used, erroneous input and output signals can be produced. Also, in case a filament is formed as in another conventional embodiment of the prior art, a short can occur between the top and bottom plates of the capacitor, thereby causing failure in the capacitor.

SUMMARY OF THE INVENTION

Therefore, an object of the present invention is to provide a method of manufacturing a capacitor of semiconductor device which can form identical areas of the top plate and the bottom plate of the capacitor.

To achieve this object, a method of manufacturing a capacitor of semiconductor device according to the present invention, comprises the steps of:

forming a field oxide film in a field region of a silicon substrate; forming a gate oxide film in an active region of the silicon substrate; sequentially forming first, second and third conducting layers on the entire structure including the field oxide film and the gate oxide film; forming a dielectric film on the third conducting layer; sequentially forming fourth and fifth conducting layers on the dielectric film; sequentially etching the fifth, fourth conducting layers, the dielectric film and third conducting layer by a first etching process to form top plates having the fifth and fourth conducting layers, sequentially etching the second and first conducting layers by a second etching process to form bottom plates having the first, second and third conducting layers, thereby forming a first and second imaginary capacitors which have top and bottom plates on the field oxide film, respectively, and are adjacent to each other; forming an interlayer insulation film on the entire structure including the first and second imaginary capacitors; forming contact holes to exposure a portion of the top and bottom plates of the first and second imaginary capacitors; performing a metal contact process to interconnect the top plate of the first imaginary capacitor and the bottom plate of the second imaginary capacitor, and to interconnect the bottom plate of the first imaginary capacitor and the top plate of the second imaginary capacitor, thereby forming a real capacitor.

BRIEF DESCRIPTION OF THE DRAWINGS

To better understand the nature and the object of the present invention, reference should be made to the following detailed descriptions made in conjunction with the accompanying drawings in which:

FIG. 1 is a sectional view of a capacitor according to a conventional embodiment.

FIG. 2 is a sectional view of a capacitor according to another conventional embodiment.

FIGS. 4A through 4D are sectional views showing the steps of manufacturing a capacitor according to the present invention.

FIG. 5 shows a layout of the present invention.

Similar reference characters refer to similar parts through the several views of the drawings.

DESCRIPTION OF THE INVENTION

Below, the present invention will be described in detail by reference to the accompanying drawings.

Figs. 4A through 4D illustrate sectional views of the device showing the steps of manufacturing a capacitor according to the present invention, and FIG. 5 shows a layout of the present invention.

Figure 3:
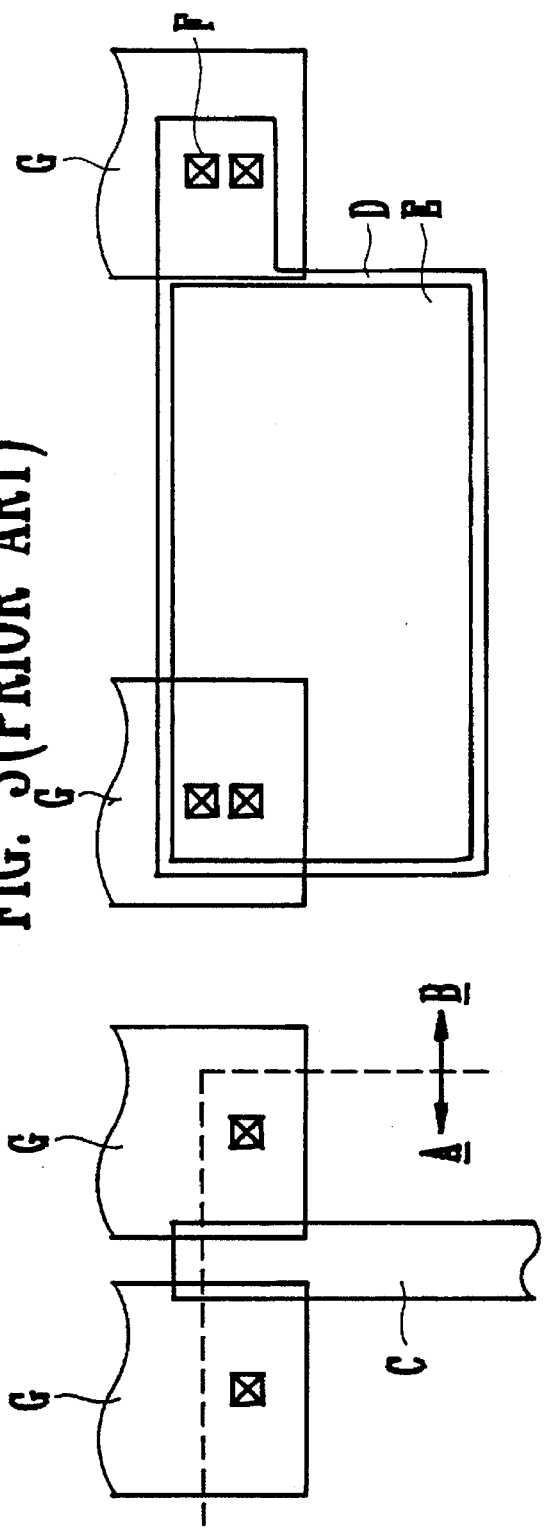
FIG. 3 shows a layout of FIGS. 1 and 2.
Figure 4A:
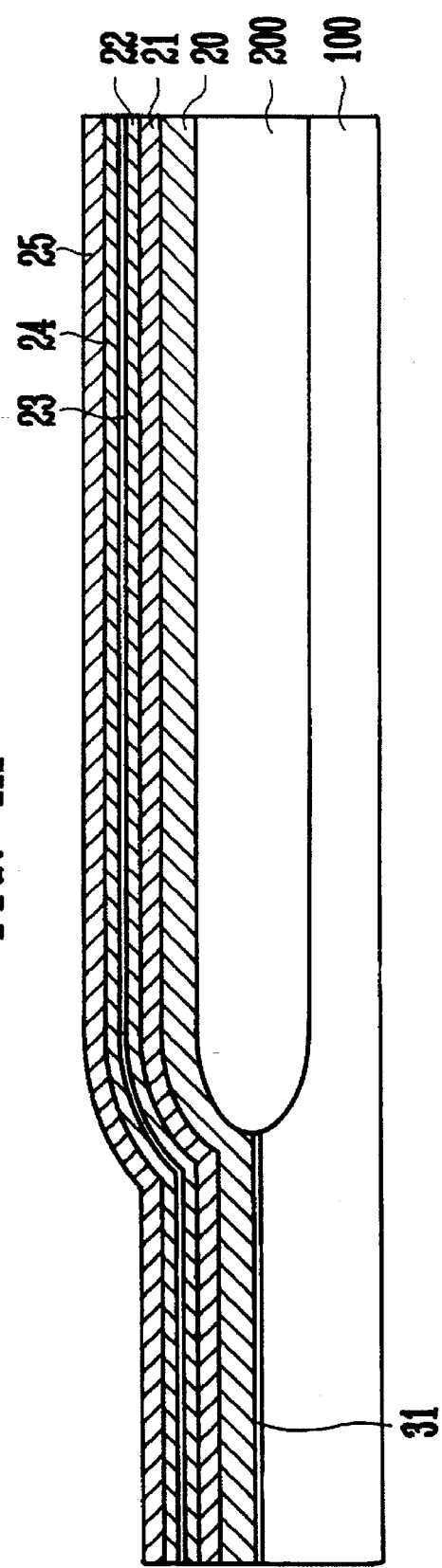

Referring to FIG. 4A, an active region A and a filed region B are defined by isolation technology. A field oxide film 200 is formed on a silicon substrate 100 in the field region B. A gate oxide film 31 of the transistor is formed on the silicon substrate 100 in the active region A. To form the bottom plate an imaginary capacitor, one or more conducting layers are formed on the field oxide film 200 and the gate oxide film 31. In the accompanying drawing, the three-layered structure of the bottom plate of the imaginary capacitor (i.e., the first, second, and third conducting layers 20, 21 and 22) are sequentially formed on the field oxide film 200 and the gate oxide film 31. A dielectric film 23 is formed on the third conducting layer 22. To form the top plate of the imaginary capacitor, one or more conducting layers are formed on the dielectric layer 23. In the accompanying drawing, the two-layered structure of the top plate of the imaginary capacitor (i.e., the fourth and fifth conducting layers 24 and 25) are sequentially formed.

In the above, it is preferable to form the first conducting layer 20 by depositing polysilicon, the second conducting layer 21 by depositing tungsten silicide, the third conducting layer 22 by depositing polysilicon with a high impurity concentration, the fourth conducting layer 24 by depositing polysilicon with a high impurity concentration, and the fifth conducting layer 25 by depositing tungsten silicide. This ensures that the conditions of the top plate and the bottom plate in the capacitor will be identical. However, the present invention may use any other material (which does not affect the dielectricity) to form each of the top and bottom plates of the imaginary capacitor which as described below. The dielectric film 23 usually utilizes an ONO structure, but an oxide film or a material of a high dielectricity may also be utilized.

Figure 4B:
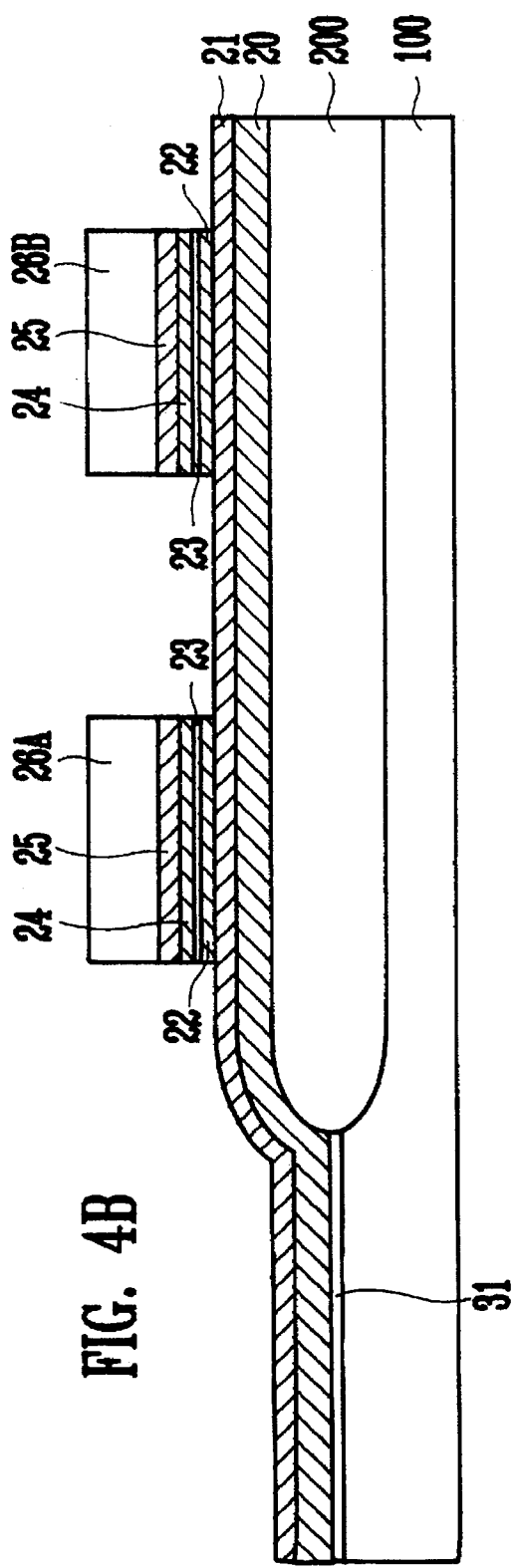

Referring to FIGS. 4B and 5, first and second photoresist patterns 26A and 26B with identical dimensions are formed on portions of the fifth conducting layer 25 of the field oxide film 200. The fifth and fourth conducting layers 25 and 24 are patterned by a first etching process using the first and second photoresist patterns 26A and 26B as an etching mask. As the first etching process continues, the dielectric film 23 and the third conducting layer 22 are patterned.

Figure 4C:
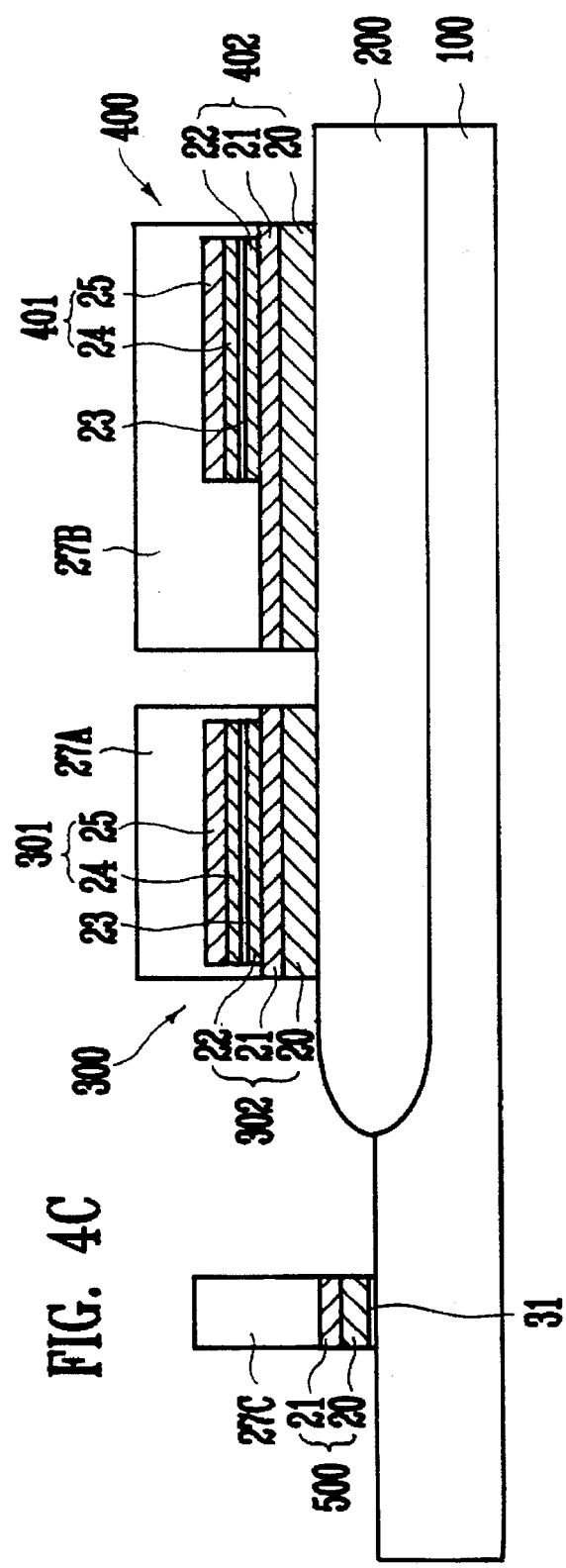

Referring to FIGS. 4C and 5, the first and second photoresist patterns 26A and 26B are removed. The third and fourth photoresist patterns 27A and 27B with identical dimensions are formed on the portions of second conducting layer 21 of the field oxide film 200 and a fifth photoresist pattern 27C is formed on the second conducting layer 21 at the portion of the gate electrode region C in the active region A. The dimensions of each of the third and fourth photoresist patterns 27A and 27B is greater than that of the first and second photoresist patterns 26A and 26B. The second conducting layer 21 and the first conducting layer 20 are patterned by a second etching process using the third, fourth and fifth photoresist patterns 27A, 27B and 27C as an etching mask.

A first imaginary capacitor 300 is formed by the first and second etching process using the first and third photoresist patterns 26A and 27A. The first imaginary capacitor 300 has the top plate 301 consisting of the fourth and fifth conducting layer 24 and 35, and bottom plate 302 consisting of the first, second and third conducting layers 20, 21 and 23 and the dielectric layer 23.

Also, a second imaginary capacitor 400 is formed by the first and second etching process using the first and third photoresist patters 26B and 27B. The second imaginary capacitor 400 has the top plate 401 consisting of the fourth and fifth conducting layer 24 and 35, and bottom plate 402 consisting of the first, second and third conducting layers 20, 21 and 23 and the dielectric layer 23.

The dimensions of the top plate 301 of the first imaginary capacitor 300 is identical that of the top plate 401 of the second imaginary capacitor 400. The dimensions of the bottom plate 302 of the first imaginary capacitor 300 is identical that of the bottom plate 402 of the second imaginary capacitor 400.

The bottom plates 302 and 402 of the two imaginary capacitors 300 and 400 are formed in consideration of the contact holes F into which the metal wires are to be connected when a subsequent metal contact process is carried out. Accordingly, the dimensions of each of the bottom plates 302 and 402 is greater than that of the top plates 301 and 401.

A gate electrode 500 of the transistor C having the first and second conducting layer 20 and 21 is formed at the active region A.

Referring to FIGS. 4D and 5, the third, fourth and fifth photoresist patterns 27A, 27B and 27C are removed. In order to complete the transistor C in the active region A, diffusion regions 32A and 32B are formed using a source and drain impurity ion implantation process. The interlayer insulation film 28 is formed on the entire structure including the transistor and the two imaginary capacitors 300 and 400. After forming an interlayer insulation film 28, a plurality of contact holes F are formed in order to exposure the diffusion regions 32A, 32B of the transistor C and each portion of said top and bottom plates 301, 401 and 302, 402 of the first and second imaginary capacitors 300 and 400. And then, a metal contact process is performed. The metal wires 30 are formed at the metal wire regions G. The top plate 301 of the first imaginary capacitor 300 and the bottom plate 402 of the second imaginary capacitor 400 are connected by metal wire 30, whereby a first plate of the real capacitor according to the present invention is formed. The bottom plate 302 of the first imaginary capacitor 300 and the top plate 401 of the second imaginary capacitor 400 are connected by metal wire 30, whereby a second plate of the real capacitor according to the present invention is formed.

The real capacitor of the present invention is produced with the dielectric film locating between the first plate and the second plate of the real capacitor. The area of the first plate of the real capacitor is identical that of the second plate of the real capacitor.

Therefore, the capacitor according to the present invention has a symmetric value of capacitance, whereby an exact analog output signal corresponding to the analog input signal can be sent and, further, various materials can be used to compose the top and the bottom plates of the capacitor.

Although this invention has been described in its preferred embodiment with a certain degree of particularity, one skilled in the art would know that the preferred embodiment disclosed here is only an example and that the construction, combination and arrangement of its parts may be varied without departing from the spirit and the scope of the invention.

What is claimed is:

1. A method of manufacturing a capacitor, comprising:
   providing a silicon substrate having a field region and an active region therein, said field region and said active region being positioned relative to each other in said silicon substrate;

forming a field oxide film in said field region of said silicon substrate;

forming a gate oxide film in said active region of said silicon substrate;

sequentially forming first, second and third conducting layers on at least said field oxide film and said gate oxide film;

forming a dielectric film on said third conducting layer;

sequentially forming a fourth conducting layer and a fifth conducting layer on said dielectric film;

sequentially etching said fifth conducting layer, said fourth conducting layer, said dielectric film, and said third conducting layer using a first etching process to form a first top plate and a second top plate on said field oxide film in said field region of said silicon substrate, said first top plate and said second top plate being positioned relative to each other on said field oxide film in said field region and having said fifth and fourth conducting layers;

sequentially etching said second and first conducting layers using a second etching process to form a first bottom plate underneath said first top plate and a first portion of said dielectric film on said field oxide film in said field region and a second bottom plate underneath said second top plate and a second portion of said dielectric film on said field oxide film in said field region, said first bottom plate and said second bottom plate having said first, second and third conducting layers, thereby said first top plate, said first portion of said dielectric film, and said first bottom plate forming a first imaginary capacitor, and said second top plate, said second portion of said dielectric film, and said second bottom plate forming a second imaginary capacitor;

forming an interlayer insulation film on said silicon substrate over said first and second imaginary capacitors and a region between said first and second imaginary capacitors;

forming contact holes to expose a portion of each of said first and second top and bottom plates of said first and second imaginary capacitors; and using a metal contact process to electrically interconnect said first top plate of said first imaginary capacitor to said second bottom plate of said second imaginary capacitor, and to electrically interconnect said first bottom plate of said first imaginary capacitor to said second top plate of said second imaginary capacitor, thereby forming a real capacitor.

2. The method of claim 1, wherein said first top plate and said second top plate of said first and second imaginary capacitors are substantially identical to each other in dimension.

3. The method of claim 1, wherein said first bottom plate and said second bottom plate of said first and second imaginary capacitors are substantially identical to each other in dimension.

4. The method of claim 1, wherein dimensions of said first and second conducting layers of said first and second imaginary capacitors are greater than dimensions of said fourth and fifth conducting layers of said first and second imaginary capacitors.

5. The method of claim 1, wherein each of said first and said second bottom plates of said first and second imaginary capacitors is formed by sequentially depositing polysilicon, tungsten silicide, and polysilicon with a high impurity concentration.

6. The method of claim 1, wherein each of said first and second top plates of said first and second imaginary capacitors is formed by sequentially depositing polysilicon with a high impurity concentration and tungsten silicide.

7. A method of manufacturing a capacitor, comprising the steps of:

providing a silicon substrate having a field region and an active region therein, said field region and said active region being positioned relative to each other in said silicon substrate;

forming a field oxide film in said field region of said silicon substrate;

forming a gate oxide film in said active region of said silicon substrate;

sequentially forming first, second and third conducting layers on said silicon substrate, said conducting layers covering said field oxide film and said gate oxide film;

forming a dielectric film on said third conducting layer;

sequentially forming a fourth conducting layer and fifth conducting layer on said dielectric film;

sequentially etching a first portion of said fifth, fourth conducting layers, said dielectric film and third conducting layer by a first etching process to form top plates having said fifth and fourth conducting layers on said field oxide film in said field region;

sequentially etching a second portion of said second and first conducting layers by a second etching process to form a gate electrode on said gate oxide film in said active region, and to form bottom plates having said first, second and third conducting layers on said field oxide film in said field region, thereby forming first and second imaginary capacitors on said field oxide film having said top and bottom plates on said field oxide film, respectively, and said first and said second imaginary capacitors being located on said field oxide film in said field region and adjacent to each other therein;

forming a diffusion region at said gate electrode by source and drain impurity ion implantation process;

forming an interlayer insulation film on the entire structure including said first and second imaginary capacitors;

forming contact holes to exposure said diffusion regions of said gate electrode in said active region and a portion of each of said top and bottom plates of said first and second imaginary capacitors in said field region; and performing a metal contact process to electrically interconnect said top plate of said first imaginary capacitor and said bottom plate of said second imaginary capacitor, and to electrically interconnect said bottom plate of said first imaginary capacitor and said top plate of said second imaginary capacitor, respectively, thereby forming a real capacitor.

* * * * *